United States Patent
Chang et al.

(10) Patent No.: US 9,574,832 B2
(45) Date of Patent: Feb. 21, 2017

(54) ENABLING AN ALUMINUM HEAT EXCHANGER WITH A WORKING FLUID

(75) Inventors: Je-Young Chang, Phoenix, AZ (US);
Choong-Un Kim, Arlington, TX (US);
Himanshu Pokharna, Santa Clara, CA (US); Rajiv K. Mongia, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 2333 days.

(21) Appl. No.: 12/005,784

(22) Filed: Dec. 28, 2007

(65) Prior Publication Data

US 2009/0166014 A1    Jul. 2, 2009

(51) Int. Cl.

| F28F 13/18 | (2006.01) |
|---|---|
| F28F 19/02 | (2006.01) |
| F28F 19/06 | (2006.01) |
| F28D 15/02 | (2006.01) |
| F28F 21/08 | (2006.01) |
| H01L 23/373 | (2006.01) |
| H01L 23/473 | (2006.01) |
| H01L 23/427 | (2006.01) |

(52) U.S. Cl.
CPC .............. *F28F 19/06* (2013.01); *F28D 15/02* (2013.01); *F28F 21/084* (2013.01); *H01L 23/3735* (2013.01); *H01L 23/473* (2013.01); *F28F 2245/02* (2013.01); *H01L 23/427* (2013.01); *H01L 2924/0002* (2013.01)

(58) Field of Classification Search
CPC ........ F28F 19/06; F28F 21/08; F28F 2245/02; H01L 23/3735; H01L 23/427; H01L 23/473

USPC ........ 165/134.1, 133, 138, DIG. 6; 427/232, 427/239

See application file for complete search history.

(56) References Cited

U.S. PATENT DOCUMENTS

| 3,133,787 | A | * | 5/1964 | Kelley, Jr. ........................ 422/15 |
|---|---|---|---|---|
| 4,182,399 | A | * | 1/1980 | Popplewell ................... 165/133 |
| 4,368,776 | A | * | 1/1983 | Negita et al. ................. 165/133 |
| 4,783,224 | A | * | 11/1988 | Sako et al. .................... 148/251 |
| 4,830,101 | A | * | 5/1989 | Ohara et al. .................. 165/133 |
| 4,954,372 | A | * | 9/1990 | Sako et al. ................. 427/388.2 |
| 5,070,938 | A | * | 12/1991 | Mizuno et al. .............. 165/133 |
| 5,376,411 | A | * | 12/1994 | Nishishita .................... 427/379 |
| 5,500,288 | A | * | 3/1996 | Isobe et al. ................... 428/469 |
| 5,538,078 | A | * | 7/1996 | Mizuno et al. .............. 165/133 |
| 7,309,453 | B2 |  | 12/2007 | Chang et al. ................... 252/75 |

(Continued)

OTHER PUBLICATIONS

Bibber, John W; A Chrome-Free, Aluminum-Oxide Conversion Coating Process; Fourth Quarter 2005; Finishing Line, v21 n4 p. 1-5, p. 5.*

(Continued)

*Primary Examiner* — Len Tran
*Assistant Examiner* — Claire Rojohn, III
(74) *Attorney, Agent, or Firm* — Trop, Pruner & Hu, P.C.

(57) ABSTRACT

In one embodiment, a heat exchanger may be formed using a corrosion-resistant aluminum material to enable usage of water as a working fluid for the exchanger. In one embodiment, the exchanger may have an aluminum substrate with multiple treated layers formed thereon. A first treated layer corresponds to a hydrated aluminum oxide layer, and a second treated layer corresponds to a mono-layer organic molecule layer. Other embodiments are described and claimed.

12 Claims, 3 Drawing Sheets

(56) References Cited

U.S. PATENT DOCUMENTS

| | | | | |
|---|---|---|---|---|
| 2002/0016250 A1* | 2/2002 | Hayakawa | ............... | C03C 17/23 |
| | | | | 502/5 |
| 2002/0187335 A1* | 12/2002 | Kelley | ................... | B82Y 30/00 |
| | | | | 428/315.9 |
| 2003/0175626 A1* | 9/2003 | Ryza | ..................... | B08B 7/0021 |
| | | | | 430/329 |
| 2005/0141195 A1* | 6/2005 | Pokharna et al. | ............ | 361/699 |
| 2006/0000411 A1* | 1/2006 | Seo | ......................... | C23C 16/34 |
| | | | | 118/715 |
| 2006/0131003 A1* | 6/2006 | Chang et al. | ............ | 165/104.33 |
| 2006/0157229 A1* | 7/2006 | Hong et al. | ............... | 165/104.26 |
| 2006/0219598 A1* | 10/2006 | Cody et al. | .................. | 208/255 |
| 2009/0286300 A1* | 11/2009 | Le Vot | .................. | B01F 3/0807 |
| | | | | 435/177 |

OTHER PUBLICATIONS

U.S. Appl. No. 11/444,739, filed May 31, 2006, entitled "Method, Apparatus and System for Carbon Nanotube Wick Structures," by Unnikrishnan Vadakkanmaruveedu, et al.
http://en.wikipedia.org/wiki/Monolayer, Mar. 21, 2011, IUPAC Compendium of Chemical Terminology, Second Edition 1997, "monolayer," 3 pages.

\* cited by examiner

ENABLING AN ALUMINUM HEAT EXCHANGER WITH A WORKING FLUID

BACKGROUND

As computer systems and semiconductor devices become increasingly smaller and denser, great amounts of heat are generated during operation. Accordingly, thermomechanical solutions have been introduced into such systems to aid in removing heat from such devices.

Typically, a processor in a computer, particularly a notebook computer, is adapted with an integrated heat spreader (IHS) to help draw heat away from the semiconductor device. Other systems include so-called heat pipes or thermosiphons to draw heat away from semiconductor or other heat generating components within a system. Such heat pipes typically include a working fluid. Oftentimes such heat pipes are formed of copper. However, copper is an expensive and relatively heavy material.

DETAILED DESCRIPTION

Figure 1:
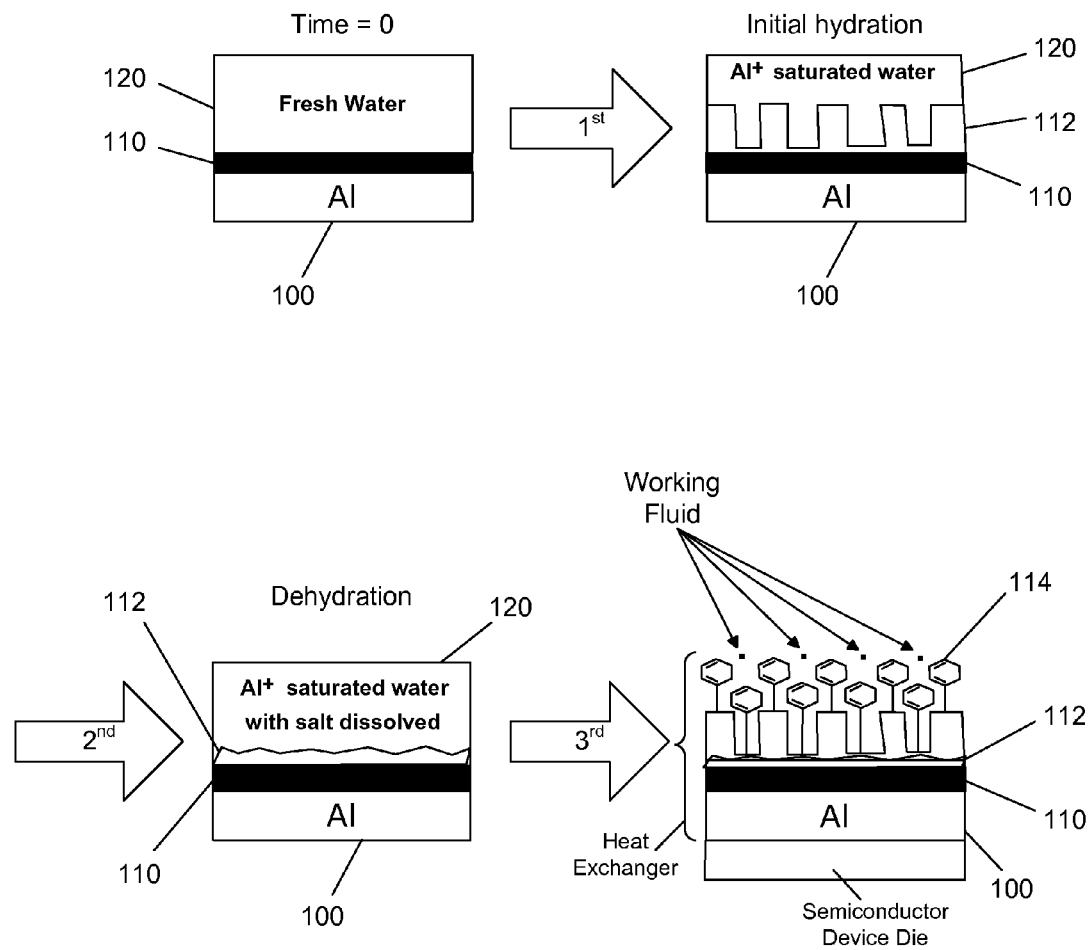
FIG. 1 is a process flow for an aluminum surface treatment in accordance with one embodiment of the present invention.

In various embodiments, a heat exchanger system may be formed of an aluminum (Al) material, rather than a copper material, reducing expense and weight, as aluminum offers gains in weight and manufacturing costs, enabling cheaper, lighter, thinner and stronger thermal solutions than copper.

For a working fluid, water may be used, as it has excellent thermal properties in both liquid and vapor phases, and it is also an environmentally friendly fluid. For example, in heat pipe applications, water's high surface tension allows it to generate higher pumping pressures through a wick structure than any other fluid does, and water's high latent heat yields the lowest mass transport rates in both liquid and vapor phases. However, water is not generally recommended as a working fluid for aluminum enclosures, because of intrinsic corrosion susceptibility of aluminum in water. Against water, aluminum is prone to corrosion induced failures caused by two reasons: 1) quick performance failure by non-condensable gas generation such as hydrogen or oxygen ($H_2$ or $O_2$); and 2) corrosion induced long-term structural failure. Quick performance failure by non-condensable gas generation ($H_2$ or $O_2$) is mostly caused by the hydration reaction of Al with water while it is also caused by other types of corrosion reactions. When Al is in contact with water, hydration of Al ensures until attainment of chemical equilibrium: $Al + H_2O \rightarrow Al_2O_3(xH_2O) + H_2\uparrow$. This reaction generates non-condensable gas ($H_2$) as a result. Corrosion also results in the long-term structural failure. Aluminum is ideally immune to corrosion once its surface is hydrated as long as a pH range between 5 and 10 is maintained. However, since confined in Al enclosure, the working fluid is subjected to a condition where its chemical properties, mostly notably pH, can be changed even with a small amount of corrosion reaction. When the pH is greater than 10 or less than 5 as a result of corrosion, aluminum oxide becomes unstable, and loses its ability of protecting the surface from corrosion. Embodiments thus may carefully control the pH of the working liquid, so as to avoid corrosion development.

Embodiments may aid in eliminating/minimizing the corrosion risk of aluminum enclosure systems (e.g., heat pipe, thermosiphon, etc.) charged with water as a working fluid. Multiple corrosion protection mechanisms may be included for making aluminum/water systems work. These elements or technologies include: 1) a first defense line, as the surface of the aluminum enclosure is treated for enhancing corrosion protection against water, thereby either removing corrosion driving force or reducing corrosion kinetics; 2) a second defense line, as working fluid is treated with chemical agents such as corrosion inhibitors and buffering salts are added to further the protection of the water/Al interface during operation. In some embodiments, inhibitors (oxidizer & passivator for protecting water/Al interface) are used in the evaporator section and volatile inhibitors for protecting vapor/Al interface are used in the condenser section.

Accordingly, multiple corrosion protection mechanisms may be adapted to enable aluminum/water-based heat exchanger systems. As mentioned above, in one embodiment the first line defense may be an aluminum surface treatment. More specifically, the surface of the aluminum enclosure can be treated before charging for enhancing its corrosion protection against water, thereby removing a driving force for initial hydration reaction and reducing corrosion kinetics during subsequent use. One of the key components of the treatment is the creation of a dense layer of hydrated Al oxide. Since the hydration reaction is the first reaction that occurs when Al becomes in touch with water and also produces non-condensable gas, its removal or minimization after charging is necessary in order to prevent short-term performance failure. By reacting Al surface with water, thereby creating a dense layer of chemically stable hydro-oxide layer, the driving force for further hydration (and generation of non-condensable gas) is reduced, if not removed.

The treatment may include three steps, in one embodiment: a hydration treatment; a de-hydration treatment; and a second hydration and organic (or conversion) coating treatment. More specifically, in one embodiment the hydration step may treat the aluminum device in hot or boiling water for approximately 10 to 20 minutes. A natural oxide layer ($Al_2O_3$) already exists over the aluminum surface exposed in atmosphere, but its thickness is only approximately 2 nanometers (nm). This process is for growing a thick, hydrated oxide layer ($Al_2O_3(xH_2O)$) over the aluminum surface (thickness approximately 100~200 nm). For the de-hydration treatment, in one embodiment after performing the hydration treatment, add a salt in the hot (or boiling) water, where the aluminum device is treated for approximately 5 minutes. The hydrated aluminum oxide ($Al_2O_3(xH_2O)$) is chemically stable, but the layer may be porous. This process is for de-hydrating the hydrated aluminum oxide, thereby enabling densification of the porous layer. After de-hydration, the second hydration and organic coating treatment may be performed. In one embodiment this treatment may treat the aluminum device in hot (or boiling) water with an organic additive (e.g., amine thiols, benzoic acid, or carboxylic acid). This process is for growing additional hydroxide layer and also for generating a mono-layer organic molecule layer on the surface of hydroxide, thereby further strengthening the passivation stability and protecting the aluminum surface from occasional pitting corrosion attack. Also, the mono-layer organic molecule coating makes the surface hydrophilic, which helps to boost capillary pumping and evaporation performance of wick structures used in heat pipes. In another embodiment, these surface treatments may be used in conjunction with the conversion process, that is to convert part of hydrated oxide into more stable oxides, including chromium oxide ($Cr_2O_3$) and magnesium oxide ($Mn_2O_3$). Preferred embodiment of the conversion layer is to treat hydrated surface in water containing appropriate chemicals such as potassium chromate ($K_2Cr_2O_7$) and potassium permanganate ($KMnO_4$). The conversion treatment can be done in temperature ranging from room to boiling condition. The inclusion of this conversion layer may enhance the stability of Al surface and thus corrosion resistance.

Referring now to FIG. 1, shown is a process flow for an aluminum surface treatment in accordance with one embodiment of the present invention. As shown in FIG. 1, at an initial time equal to zero an aluminum substrate 100 includes a natural aluminum oxide layer 110 which may be treated in hot (or boiling) water 120. Thus after this initial hydration, a porous hydrated aluminum oxide 112 is formed, causing the fresh water to turn to Al+ saturated water 120. Next a de-hydration treatment may occur in which Al+ saturated water 120 with dissolved salt treats aluminum substrate 100 to thereby densify porous layer 112. Finally, after the second hydration and organic coating treatment, in addition to porous layer 112, a mono-layer organic molecule layer 114 may be formed. In one embodiment, layer 112 may be approximately 100 nm, while organic molecule layer 114 may be approximately 3 nm, although the scope of the present invention is not limited in this regard.

The hydration treatment, that induces growth of hydrated oxide, does not have to be conducted in pure water but can be done in water containing small amount of chemical additives that are known to reduce the growth rate of hydrated oxide. Such chemicals include inorganic salts or organic polymers (or their combinations) containing permanganate, silicate and polyphosphate ions. Incorporation of such ions in treating water, while reducing hydration kinetics, assists growth of a dense hydroxide layer. Also, the inclusion of such ions in hydroxide layer, as they are strong oxidants, enhances the passivation power of hydroxide against further hydration and corrosion during operation of thermal devices.

After such processing, a heat exchanger may be ready for loading with a working fluid. To enable longevity and avoid corrosion issues, second line defense may be enacted. Accordingly, in one embodiment the water to be used as a working fluid may be the water that is purified and neutralized, and then corrosion inhibitors may be added to the water to protect the water/Al interface during operation.

As to the treatment of working fluid, purification and neutralization, it is necessary to eliminate the common contaminants in water. When water is contaminated, the pitting corrosion can develop on the aluminum surface, generating either $H_2$ or $O_2$ gas, because the presence of contaminants impedes protection power of the hydroxide layer by creating sites for galvanic corrosion. Especially, heavy metal and halide ions easily cause corrosion development on Al surface. Therefore, water must be purified to be contaminant free. Thus in various embodiments, water may be purified and neutralized to remove the potential driving force for pitting corrosion development. Note in some embodiments the water used in the hydration treatment of the aluminum surface treatment can be salvaged. The reacted water with Al enclosure contains dissolved Al ions in concentration near to equilibrium point. Therefore, use of the reacted water makes the water/hydroxide near to the equilibrium condition, thereby assisting attainment of ideal condition for resisting hydration and corrosion during operation of thermo-mechanical devices. Finally, a small amount of buffering salt may be added for helping to stabilize pH of the water during operation.

Then, corrosion inhibitors may be added to the working fluid. This step is for minimizing the risk of pitting corrosion for all engineering Al alloys as well as for repairing the protection layer created by pre-treatment of Al enclosure. Corrosion inhibitors are added to protect the water/Al interface during operation. More specifically, an oxidizer and passivator for protecting the water/Al interface may be used in an evaporator section, while volatile chemicals containing thiol group (e.g., organic polymer with sulfur), amin group or carboxylate group ions as one of constituents for protecting the vapor/Al interface may be used in a condenser section. Preferably, the vapor pressure of volatile additives is similar to that of water in working condition of device, such that their presence does not interfere with evaporation and condensation behavior of working fluid. Also preferred is that the ions have high affinity to either hydroxide or Al oxide. Participating in working cycle of working fluid but having high affinity to Al surface, they have an ability of repairing the damaged surface (such as the one denuded from polymer mono-layer coating) whenever the damage occurs.

Figure 2:
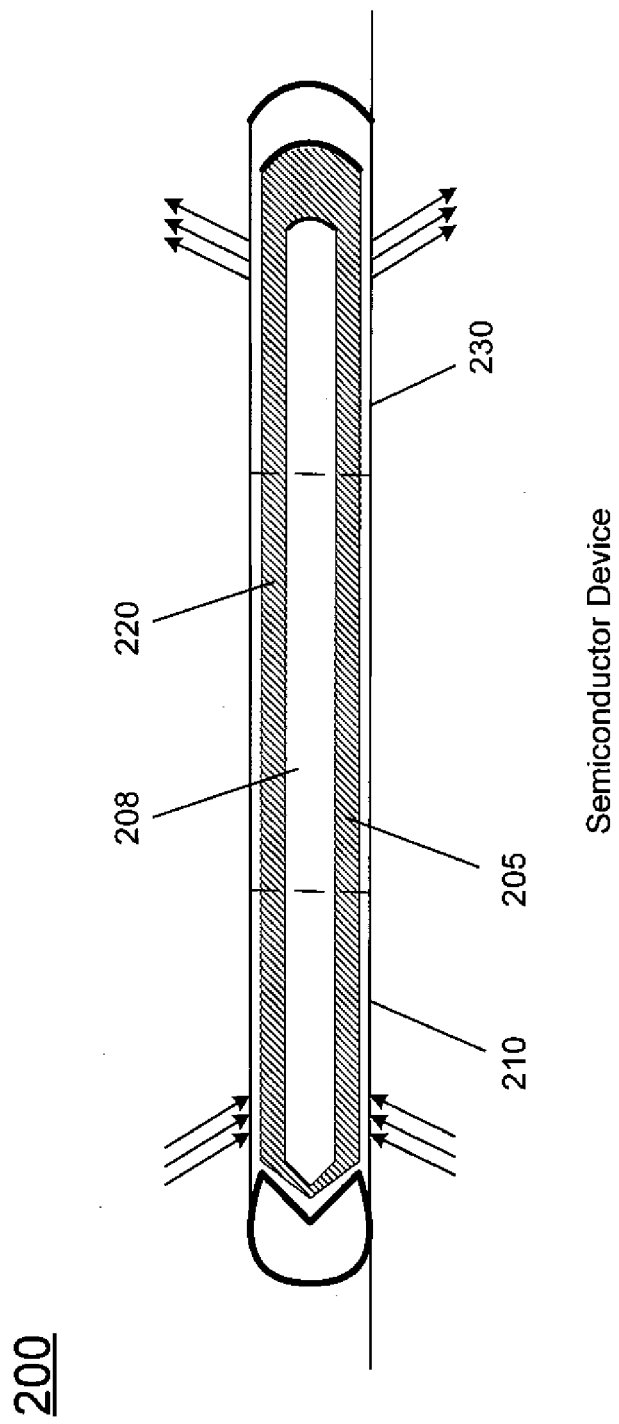
FIG. 2 is a partial cross-section of a heat exchanger in accordance with one embodiment of the present invention.

In some embodiments a corrosion protection mechanism may be provided for an aluminum/water system such as a heat pipe, where three different heat transfer sections exist with different boundary conditions. As shown in FIG. 2, which is a partial cross-section view of a heat pipe treated in accordance with an embodiment such that its internal surface, generally denoted 205, includes a mono-organic layer and a treated aluminum oxide layer. As shown in FIG. 2, heat pipe 200 includes an evaporator section 210, an adiabatic section 220 and a condenser section 230. As shown in FIG. 2, heat (represented by arrows) is incoming to heat pipe 200 in evaporator section 210, and leaves heat pipe 200 through condenser section 230. As shown in FIG. 2, heat pipe 200 may be formed of an aluminum material having a working liquid 208 adapted therein, which may be water, as described above. As shown in FIG. 2, evaporator section 210 has an aluminum/liquid interface, adiabatic section 220 has an aluminum/liquid interface with purified water, while condenser section 230 has an aluminum/vapor interface.

Embodiments may be used in many different heat exchanger systems, including heat pipes, nano/microwick structures, which may be directly formed on silicon or copper surfaces. In this way, a heat pipe device may be integrated on silicon or within an IHS formed thereon for improving heat spreading performance.

Heat pipes having a wick structure have extremely high surface area/liquid volume ratio (A/V), which imposes a challenge, since a small surface imperfection can cause runaway failure which may occur with an untreated Al surface. In this failure type, an initial hydration reaction changes pH, and the pH level at the evaporation section moves away from safe range even with a small amount of reaction. Corrosion accelerates as the passivation layer becomes unstable. Embodiments thus may prevent such a failure.

Figure 3:
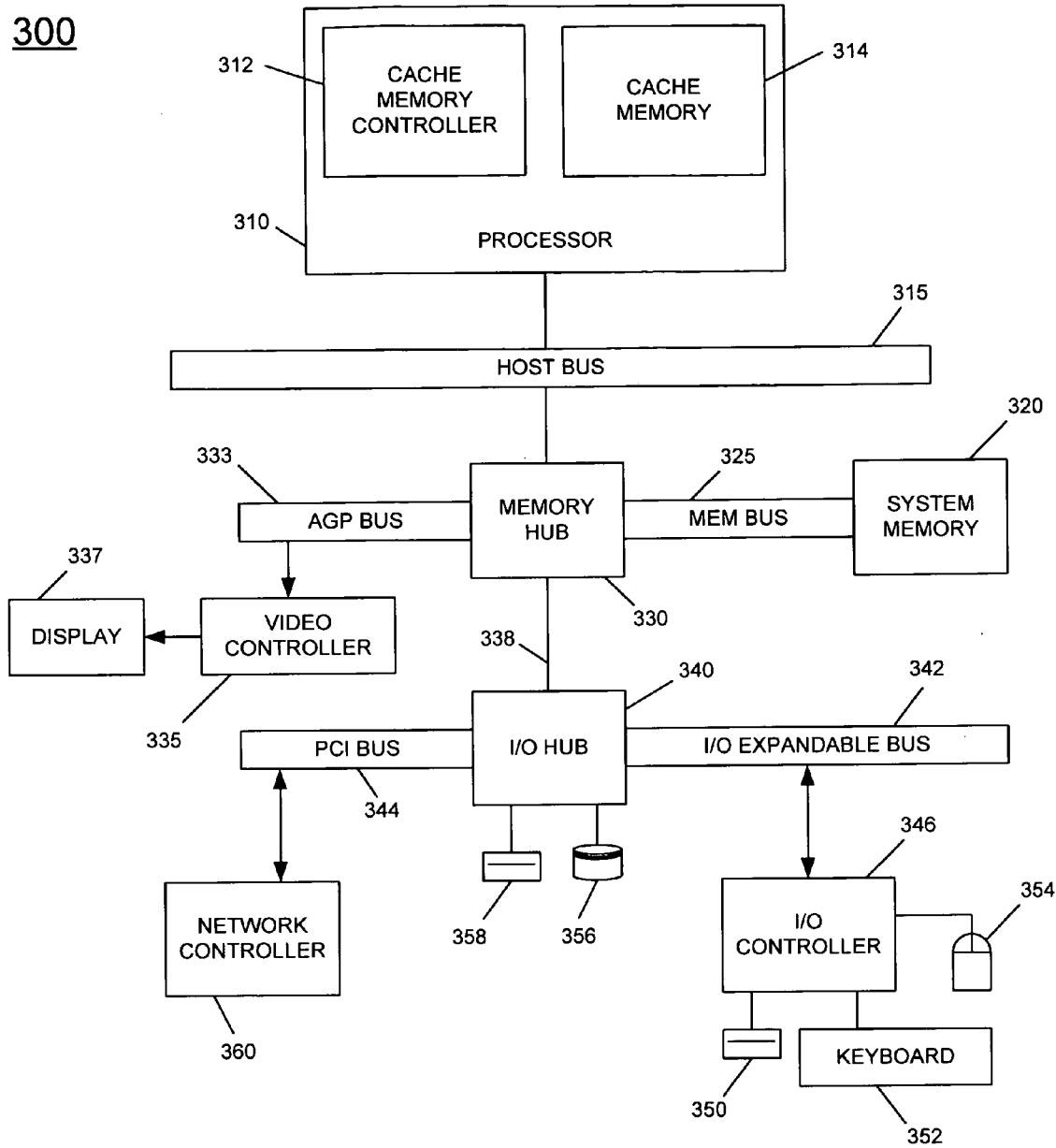
FIG. 3 is a block diagram of a computer system in which embodiments of the invention may be used.

Semiconductor packages including a heat exchanger formed in accordance with an embodiment may be used in various systems. FIG. 3 is a block diagram of a computer system 300 in which embodiments of the invention may be used. As used herein, the term "computer system" may refer to any type of processor-based system, such as a notebook computer, a server computer, a laptop computer, or the like.

Now referring to FIG. 3, in one embodiment, computer system 300 includes a processor 310, which may include a general-purpose or special-purpose processor such as a microprocessor, microcontroller, a programmable gate array, and the like. Processor 310 may include a cache memory controller 312 and a cache memory 314. Processor 310 may be coupled over a host bus 315 to a memory hub 330 in one embodiment, which may be coupled to a system memory 320 (e.g., a dynamic RAM) via a memory bus 325. Memory hub 330 may also be coupled over an Advanced Graphics Port (AGP) bus 333 to a video controller 335, which may be coupled to a display 337.

Memory hub 330 may also be coupled (via a hub link 338) to an input/output (I/O) hub 340 that is coupled to an input/output (I/O) expansion bus 342 and a Peripheral Component Interconnect (PCI) bus 344, as defined by the PCI Local Bus Specification, Production Version, Revision 2.1 dated June 1995. In one embodiment, processor 310 (at least) may be adapted in a package having one or more heat exchangers such as heat pipes having a nano/microwick structure formed in accordance with an embodiment of the present invention on one or both of a semiconductor die and package substrate and coupled, e.g., through a socket to a circuit board of system 300.

I/O expansion bus 342 may be coupled to an I/O controller 346 that controls access to one or more I/O devices. As shown in FIG. 3, these devices may include in one embodiment storage devices, such as a floppy disk drive 350 and input devices, such as a keyboard 352 and a mouse 354. I/O hub 340 may also be coupled to, for example, a hard disk drive 358 and a compact disc (CD) drive 356, as shown in FIG. 3. It is to be understood that other storage media may also be included in the system.

PCI bus 344 may also be coupled to various components including, for example, a network controller 360 that is coupled to a network port (not shown). Additional devices may be coupled to the I/O expansion bus 342 and the PCI bus 344. Although the description makes reference to specific components of system 300, it is contemplated that numerous modifications and variations of the described and illustrated embodiments may be possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
an aluminum heat exchanger having an aluminum substrate with an oxide layer, a first treated layer formed directly on the oxide layer, and a second treated layer formed on the first treated layer, the first treated layer corresponding to a hydrated aluminum oxide layer and located between the oxide layer and the second treated layer, the second treated layer corresponding to a conversion layer and a monolayer of molecules, the aluminum heat exchanger including a working fluid to contact at least the conversion layer and the monolayer, the working fluid corresponding to purified and neutralized water, wherein the aluminum heat exchanger is coupled to a semiconductor device to remove heat therefrom during operation of the semiconductor device.

2. The apparatus of claim 1, wherein the purified and neutralized water includes a buffering salt to stabilize a pH level thereof.

3. The apparatus of claim 2, wherein the purified and neutralized water includes at least one corrosion inhibitor.

4. The apparatus of claim 3, wherein the at least one corrosion inhibitor includes an organic polymer.

5. The apparatus of claim 1, wherein the aluminum heat exchanger is integrated on a surface of a die of the semiconductor device.

6. The apparatus of claim 1, wherein the first treated layer is formed directly on and in direct contact with the oxide layer with no other layer located between the oxide layer and the first treated layer.

7. The apparatus of claim 1, wherein the second treated layer is hydrophilic.

8. The apparatus of claim 1, wherein the second treated layer is hydrophilic and directly contacts the working fluid.

9. The apparatus of claim 1, wherein (a) the first treated layer is formed directly on and in direct contact with the oxide layer with no other layer located between the oxide layer and the first treated layer, and (b) the second treated layer is formed directly on and in direct contact with the first treated layer with no other layer located between the first and second treated layers.

10. The apparatus of claim 9, wherein the monolayer is self-assembled.

11. The apparatus of claim 1, wherein the monolayer is self-assembled.

12. The apparatus of claim 1, wherein the conversion layer includes at least one of $CrO_2$, $MnO_2$, and $SiO_2$.

* * * * *